US012250796B2

(12) United States Patent
Takabayashi

(10) Patent No.: US 12,250,796 B2
(45) Date of Patent: Mar. 11, 2025

(54) POWER CONVERSION DEVICE

(71) Applicant: Mitsubishi Electric Corporation, Tokyo (JP)

(72) Inventor: Hirokazu Takabayashi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 372 days.

(21) Appl. No.: 17/800,036

(22) PCT Filed: Mar. 31, 2020

(86) PCT No.: PCT/JP2020/014762
§ 371 (c)(1),
(2) Date: Aug. 16, 2022

(87) PCT Pub. No.: WO2021/199252
PCT Pub. Date: Oct. 7, 2021

(65) Prior Publication Data
US 2023/0073236 A1  Mar. 9, 2023

(51) Int. Cl.
*H05K 7/20* (2006.01)
*H02M 7/00* (2006.01)
(Continued)

(52) U.S. Cl.
CPC ........ *H05K 7/20936* (2013.01); *H02M 7/003* (2013.01); *H02M 7/537* (2013.01);
(Continued)

(58) Field of Classification Search
CPC ............. H05K 7/20145; H05K 7/1489; H05K 7/1405; H05K 7/1487; H05K 7/20209;
(Continued)

(56) References Cited

U.S. PATENT DOCUMENTS

2010/0000804 A1* 1/2010 Yeh .................. B60L 1/006
180/2.2
2019/0039461 A1* 2/2019 Uehara ............. H05K 7/20918

FOREIGN PATENT DOCUMENTS

EP       2290681 A2    3/2011
JP    H07142655 A     6/1995
(Continued)

OTHER PUBLICATIONS

Makino T, Car Control Device, CN-107848545-A, PE2E search translation (Year: 2018).*

(Continued)

*Primary Examiner* — Michael A Matey
(74) *Attorney, Agent, or Firm* — BUCHANAN, INGERSOLL & ROONEY PC

(57) ABSTRACT

The power conversion apparatus includes a housing attached to a roof of a vehicle, a heat-receiving block, and one or more heat pipes. The housing has an opening on the top in the vertical direction, and accommodates electronic components. The electronic components are attached to a first main surface, which is one of the main surfaces of the heat-receiving block. The heat-receiving block is attached to the housing and closes the opening. The one or more heat pipes are attached to a second main surface, which is the other of the main surfaces of the heat-receiving block, extend in a direction away from the heat-receiving block, and accommodate refrigerant therein.

20 Claims, 13 Drawing Sheets

(51) Int. Cl.
    *H02M 7/537* (2006.01)
    *H05K 7/14* (2006.01)
    *H02P 27/06* (2006.01)

(52) U.S. Cl.
    CPC ....... *H05K 7/1432* (2013.01); *H05K 7/20336* (2013.01); *H05K 7/209* (2013.01); *H02P 27/06* (2013.01)

(58) Field of Classification Search
    CPC ........... H05K 7/20336; H05K 7/20418; H05K 7/209; H05K 7/18; H01L 23/427; B60L 2200/26; B60L 2210/30; B60L 15/007; B60L 2210/40; B60L 2210/44; B60L 2240/525; B60L 1/00; B61C 7/04; Y02T 30/00; F28D 15/0275; H02S 20/30; H02P 27/06
    See application file for complete search history.

(56) References Cited

FOREIGN PATENT DOCUMENTS

| JP | 2003079164 A | 3/2003 |
| JP | 2011050166 A | 3/2011 |
| JP | 2011259536 A | 12/2011 |
| JP | 2017039481 A | 2/2017 |

OTHER PUBLICATIONS

Funakoshi S, Power Conversion Device and Railway Vehicle Equipped With the Same, GB-2523625-A, PE2E search translation (Year: 2015).*
Hara Y, Power conversion device, JP-11251499-A, PE2E search translation (Year: 1999).*
Hashimoto T, Power Converter, JP-2003079164-A, PE2E search translation (Year: 2003).*
Funakoshi S, Power Conversion Device and Rolling Stock, JP-2011233562-A, PE2E search translation (Year: 2011).*
Suzuki H, Vehicle Electric Power Conversion System and Railway Vehicle, JP-2015116082-A, PE2E search translation (Year: 2015).*
Funakoshi S, Vehicle Electric Power Conversion System and Railway Vehicle, JP-2016047692-A, PE2E search translation (Year: 2016).*
Extended European Search Report dated Apr. 26, 2023, issued in the corresponding European Patent Application No. 20929607.8, 8 pages.
Office Action issued in corresponding Indian Application No. 202227054658, mailed Feb. 9, 2023, 4 Pages.
International Search Report (PCT/ISA/210) with translation and Written Opinion (PCT/ISA/237) mailed on Jul. 7, 2020, by the Japan Patent Office as the International Searching Authority for International Application No. PCT/JP2020/014762. (9 pages).
Japanese Office Action dated May 17, 2022, issued for corresponding JP patent application No. 2022-512973, with English translation. (8 pages).

* cited by examiner

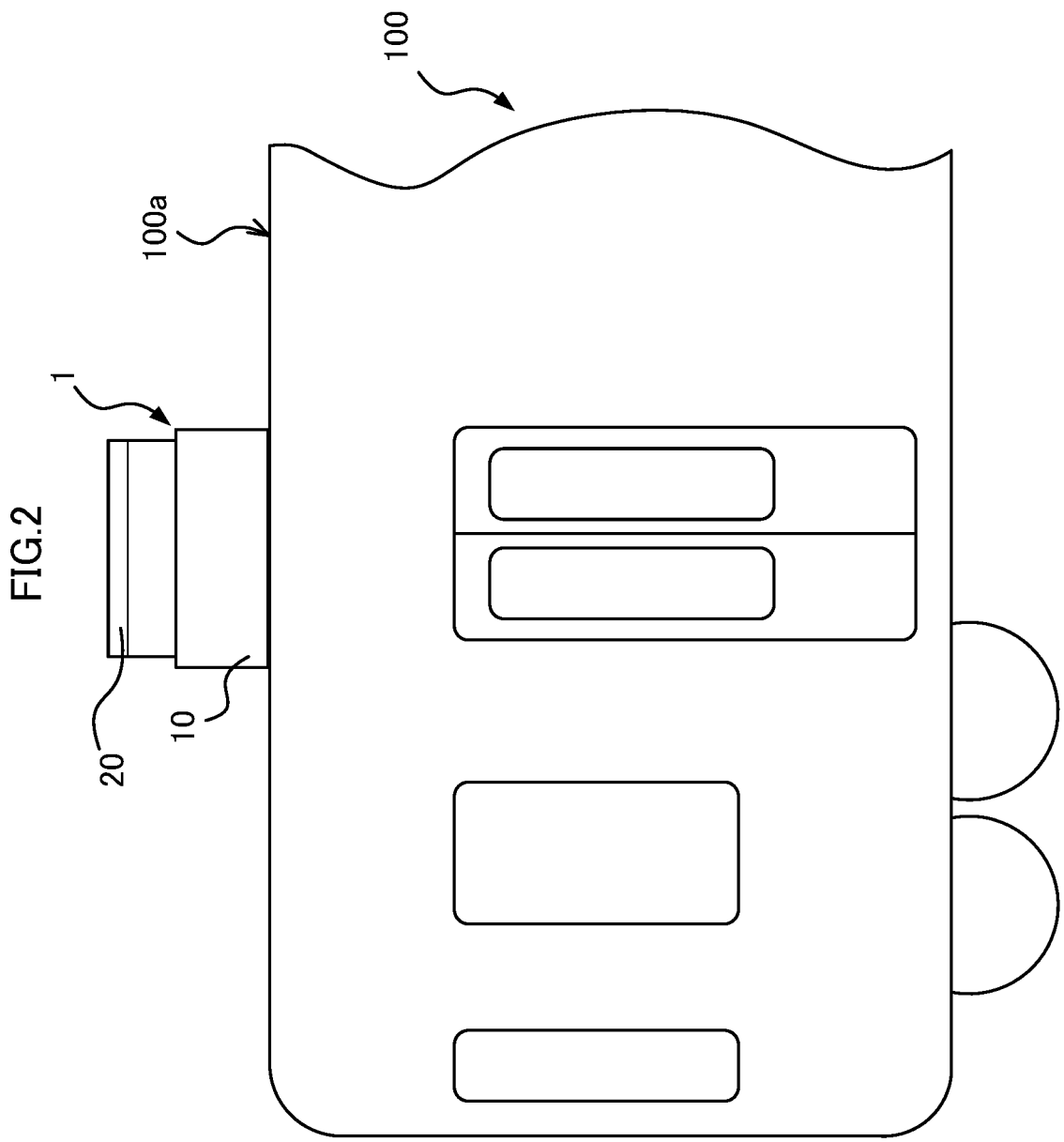
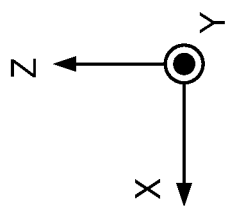
FIG.2

POWER CONVERSION DEVICE

TECHNICAL FIELD

The present disclosure relates to a power conversion apparatus.

BACKGROUND ART

In order to avoid damage in electronic components caused by heat emission from the electronic components during energization, some power conversion apparatuses installed in vehicles include cooling devices thermally coupled to the electronic components, which are heat emitters. The cooling devices discharge the heat transferred from the electronic components to traveling wind generated as vehicles travel, thereby cooling the electronic components. An example of this type of power conversion apparatuses is disclosed in Patent Literature 1. The power conversion apparatus disclosed in Patent Literature 1 is installed under the floor of a railway vehicle and includes a cooling device mounted on a side surface intersecting the lengthwise direction of railroad ties.

CITATION LIST

Patent Literature

Patent Literature 1: Unexamined Japanese Patent Application Publication No. 2011-50166

SUMMARY OF INVENTION

Technical Problem

Unfortunately, the space under the floor of the railway vehicle is limited because of installation of many devices, such as transformer and air conditioner, in addition to the power conversion apparatus. It is therefore difficult to increase the sizes of heat pipes and fins included in the cooling device and thereby expand the areas in contact with traveling wind. In addition, these many devices, which are installed under the floor of the railway vehicle as described above, inhibit the traveling wind from efficiently flowing between the fins. This fact sometimes makes it difficult to improve the cooling efficiency of a self-cooled power conversion apparatus for cooling electronic components by means of heat transfer to the traveling wind without a component, such as blower or fan.

An objective of the present disclosure, which has been accomplished in view of the above situations, is to provide a power conversion apparatus having improved cooling efficiency.

Solution to Problem

In order to achieve the above objective, a power conversion apparatus according to an aspect of the present disclosure includes a power converter, a housing, a heat-receiving block, and at least one heat pipe. The power converter includes electronic components. The power converter converts fed electric power into electric power to be fed to a load and feeds the converted electric power to the load. The housing is disposed on the roof of a vehicle and has an opening on the top in a vertical direction. The housing accommodates the electronic components. The heat-receiving block is attached to the housing and has one main surface to which the electronic components are attached. The heat-receiving block closes the opening. The at least one heat pipe is attached to the other main surface of the heat-receiving block and extends in a direction away from the heat-receiving block. The heat pipe accommodates refrigerant therein.

Advantageous Effects of Invention

The heat pipes included in the power conversion apparatus according to an aspect of the present disclosure are installed on the roof of the vehicle and can therefore efficiently transfer the heat emitted from the electronic components to the traveling wind. This configuration can accordingly improve the cooling capacity of the power conversion apparatus.

BRIEF DESCRIPTION OF DRAWINGS

FIG. 2 illustrates an exemplary manner of installation of the power conversion apparatus according to Embodiment 1 in a vehicle;

DESCRIPTION OF EMBODIMENTS

Figure 1:
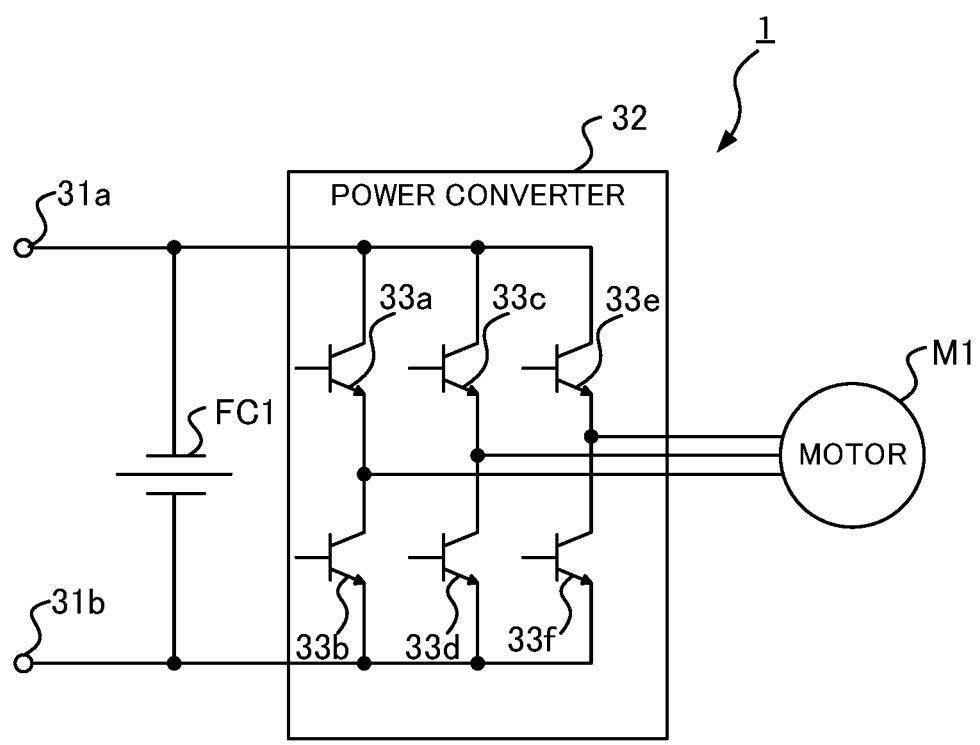
FIG. 1 is a circuit diagram illustrating a power conversion apparatus according to Embodiment 1.

A power conversion apparatus according to embodiments of the present disclosure is described in detail below with reference to the accompanying drawings. In the drawings, the components identical or corresponding to each other are provided with the same reference symbol.

Embodiment 1

A power conversion apparatus according to Embodiment 1 is described below focusing on an exemplary self-cooled power conversion apparatus installed on the roof of a railway vehicle to cool electronic components using traveling wind.

A power conversion apparatus 1 illustrated in FIG. 1 converts DC power fed from a power source, which is not illustrated, into three-phase AC power to be fed to a motor M1, which is a load, and then feeds the three-phase AC power to the motor M1. A typical example of the power source is a current collector to acquire electric power from an overhead wire. The motor M1 is a three-phase induction motor, for example.

In detail, the power conversion apparatus 1 includes a primary terminal 31a connected to the power source, a primary terminal 31b that is grounded, a filter capacitor FC1 of which the ends are connected to the respective primary terminals 31a and 31b to remove ripples, and a power converter 32 to convert the DC power fed from the power source into three-phase AC power and feed the converted power to the motor M1. The power converter 32 includes switching elements 33a and 33b corresponding to the U phase, switching elements 33c and 33d corresponding to the V phase, and switching elements 33e and 33f corresponding to the W phase. The switching elements 33a to 33f are turned on or off by a switching controller, which is not illustrated, so that the power converter 32 converts the DC power fed from the power source into three-phase AC power and feeds the converted power to the motor M1.

As illustrated in FIG. 2, the power conversion apparatus 1 is installed on a roof 100a of a vehicle 100. In detail, the power conversion apparatus 1 is mounted on the top end in the vertical direction of the roof 100a while the vehicle 100 is horizontally oriented. In FIG. 2, the X axis indicates the traveling direction of the vehicle 100. In other words, the vehicle 100 runs toward the positive side in the X-axis direction or the negative side in the X-axis direction. The Y axis indicates the width direction of the vehicle 100, in other words, the lengthwise direction of railroad ties. The Z axis is orthogonal to each of the X and Y axes. The Z axis indicates the vertical direction while the vehicle 100 is horizontally oriented.

The power conversion apparatus 1 is installed on the roof 100a of the vehicle 100 and includes a housing 10 to accommodate electronic components 11, which is described below, a cooling device 12, which is described below, mounted on the housing 10, and a cover 20 disposed over the cooling device 12. The electronic components 11 indicate the switching elements 33a to 33f and any heat emitter, such as diode or thyristor, included in the power converter 32 in FIG. 1.

Figure 3:
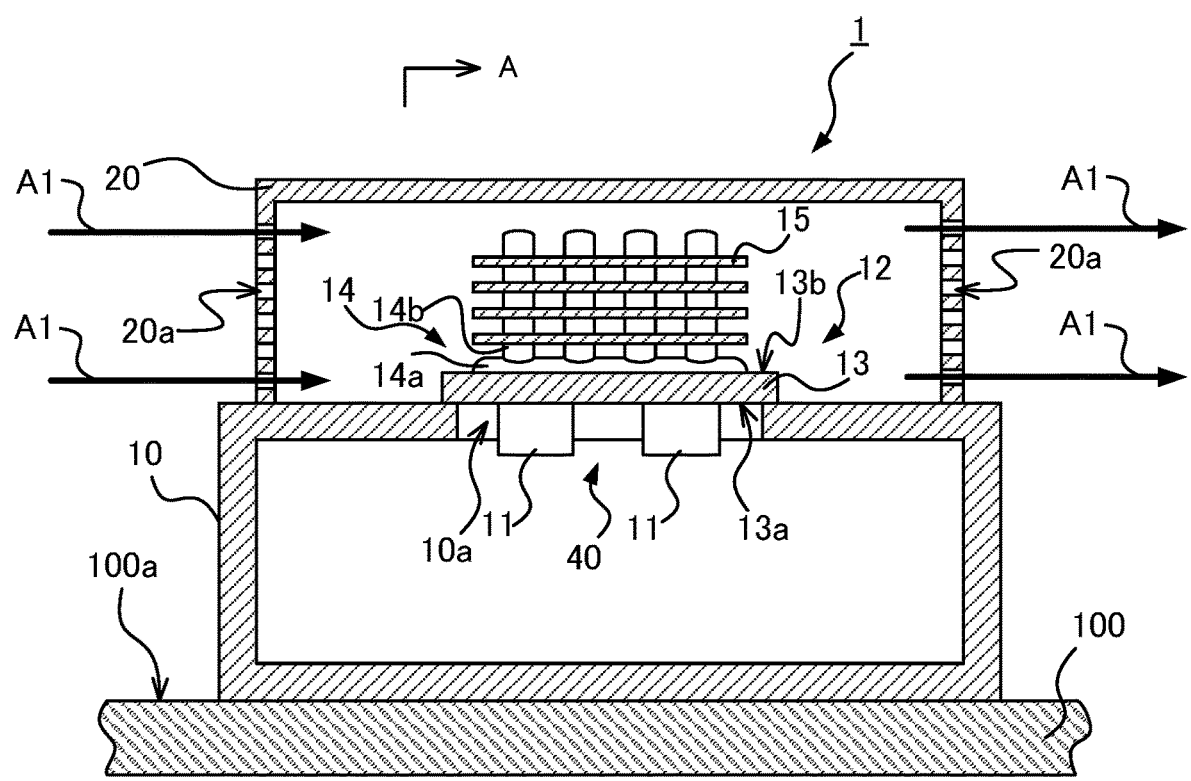
FIG. 3 is a sectional view of the power conversion apparatus according to Embodiment 1.
Figure 4:
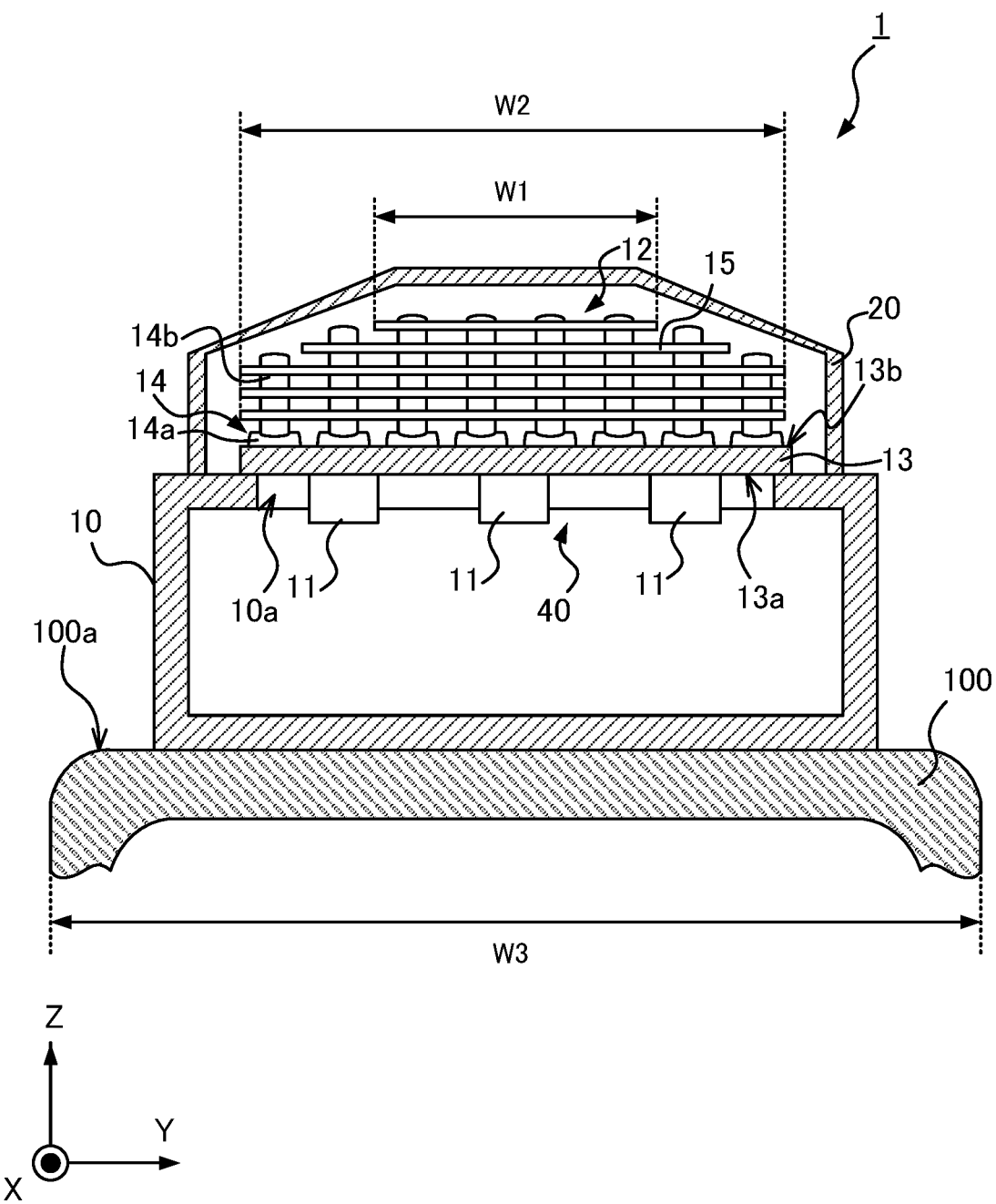
FIG. 4 is a sectional view of the power conversion apparatus according to Embodiment 1 taken along the line A-A of FIG. 3.

As illustrated in FIG. 3 and FIG. 4, which is a sectional view taken along the line A-A of FIG. 3, the housing 10 accommodates the electronic components 11 and has an opening 10a on the top in the vertical direction. The opening 10a is closed by a heat-receiving block 13 of the cooling device 12, which is described below. The closing of the opening 10a by the heat-receiving block 13 suppresses the ambient air, water, dust, and other contaminants entering the housing 10. In Embodiment 1, the housing 10 has the opening 10a penetrating through the housing 10 in the Z-axis direction while the vehicle 100 is horizontally oriented.

The housing 10 is preferably attached on the roof 100a such that the housing 10 can be attached to and detached from the roof 100a in the vertical direction while the vehicle 100 is horizontally oriented. Since the housing 10 is attachable and detachable in the vertical direction, detachment of the housing 10 from the roof 100a for maintenance of the power conversion apparatus 1 does not require detachment of electronic equipment surrounding the power conversion apparatus 1, and can thus be readily completed. Also, attachment of the housing 10 to the roof 100a does not require detachment of the electronic equipment surrounding the power conversion apparatus 1, and can thus be readily completed.

The electronic components 11 are mounted on a first main surface 13a of the heat-receiving block 13 included in the cooling device 12. The electronic components 11 emit heat in response to energization and transfer the heat to the heat-receiving block 13, as is described in detail below.

The cooling device 12 includes the heat-receiving block 13 provided with the electronic components 11, and one or more heat pipes 14 that are partially fixed at the heat-receiving block 13 and extend in a direction away from the heat-receiving block 13. Each of the heat pipes 14 accommodates refrigerant. The cooling device 12 is preferably further provided with one or more fins 15 fixed on the outer surfaces of the heat pipes 14. In Embodiment 1, the cooling device 12 includes the heat-receiving block 13, the one or more heat pipes 14, and the one or more fins 15.

The cooling device 12 and the electronic components 11 mounted on the heat-receiving block 13 of the cooling device 12 are included in a unit 40, which is preferably attached to the housing 10 such that the unit 40 can be attached to and detached from the housing 10 in the vertical direction while the vehicle 100 is horizontally oriented. In detail, the unit 40 includes the heat-receiving block 13, the one or more heat pipes 14, the one or more fins 15, and the electronic components 11 mounted on the heat-receiving block 13. Since the unit 40 is attachable and detachable in the vertical direction, detachment of the unit 40 from the housing 10 for maintenance of the unit 40 does not require detachment of the electronic equipment surrounding the power conversion apparatus 1, and can thus be readily completed. Also, attachment of the unit 40 to the housing 10 does not require detachment of the electronic equipment surrounding the power conversion apparatus 1, and can thus be readily completed.

The top end in the vertical direction of the cooling device 12 is preferably located higher than the top end in the vertical direction of the electronic equipment surrounding the power conversion apparatus 1 while the vehicle 100 is horizontally oriented. This arrangement, in which the top end in the vertical direction of the cooling device 12 is higher than the top end in the vertical direction of the surrounding electronic equipment, can improve the cooling efficiency of the power conversion apparatus 1.

The individual components of the cooling device 12 having the above-described configuration are described below focusing on an exemplary cooling device 12 including eight heat pipes 14.

The heat-receiving block 13 has the first main surface 13a and a second main surface 13b that face the opposite sides in the Z-axis direction. The electronic components 11 are attached to the first main surface 13a. The heat pipes 14 are attached to the second main surface 13b. In detail, the heat pipes 14 are inserted and fixed in grooves formed on the second main surface 13b. The heat-receiving block 13 is attached to the housing 10 and thus closes the opening 10a. The heat-receiving block 13 is made of a material having a high thermal conductivity, for example, a metal, such as copper or aluminum.

The heat pipes 14 are inserted in the respective grooves on the second main surface 13b of the heat-receiving block 13 and thus fixed at the heat-receiving block 13. The heat pipes 14 transfer heat received from the electronic components 11 via the heat-receiving block 13 to traveling wind A1, which is described below, generated as the vehicle 100 travels. The heat pipes 14 have a sufficiently high thermal conductivity of, for example, 5,000 W/mK. Each of the heat pipes 14 rapidly transfers heat received from one end fixed at the heat-receiving block 13 to the other end and is therefore capable of efficient transfer of heat to the ambient air.

The structure of each of the heat pipes 14 is described in detail below. Each heat pipe 14 has a header portion 14a and a plurality of branch portions 14b in communication with the header portion 14a. In detail, the heat pipe 14 has a single header portion 14a and four branch portions 14b. The header portion 14a is inserted in each groove on the second main surface 13b of the heat-receiving block 13, and fixed at the heat-receiving block 13 by any fixing procedure, such as bonding with an adhesive or soldering. The header portion 14a is fixed at the heat-receiving block 13 while being partially exposed from the heat-receiving block 13. The header portion 14a is made of a material having a high thermal conductivity, for example, a metal, such as copper or aluminum.

The branch portions 14b are fixed at the header portion 14a by a procedure, such as welding or soldering, and are in communication with the header portion 14a. The branch portions 14b extend in a direction away from the heat-receiving block 13, in detail, a direction away from the second main surface 13b. In Embodiment 1, the branch portions 14b extend in the Z-axis direction. The branch portions 14b are made of a material having a high thermal conductivity, for example, a metal, such as copper or aluminum.

Each of the heat pipes 14 accommodates refrigerant. The refrigerant is in a gas-liquid two-phase state at an ordinary temperature. The refrigerant is made of a substance, such as water, evaporated when receiving heat from the electronic components 11, and condensed into liquid when discharging heat to the air around the cooling device 12 via the heat pipes 14 and the fins 15, which are described below.

The individual fins 15 are fixed on the outer surfaces of the heat pipes 14. In detail, each of the fins 15 has through holes and fixed at the branch portions 14b while the branch portions 14b extend through the respective through holes. The fins 15 are made of a material having a high thermal conductivity, for example, a metal, such as copper or aluminum. In Embodiment 1, the fins 15 are made of flat-plate members, arranged with spaces therebetween in the Z-axis direction, and fixed at the branch portions 14b.

The cover 20 is attached to the housing 10 and disposed over the cooling device 12. The cover 20 has any number of vents 20a having any shape on the two surfaces intersecting the traveling direction of the vehicle 100. In detail, the two surfaces of the cover 20 orthogonal to the X axis has the vents 20a that penetrate through the cover 20 in the X-axis direction.

A mechanism for cooling the electronic components 11 in the power conversion apparatus 1 having the above-described configuration is described below. When the electronic components 11 emit heat in response to energization of the power converter 32 during running of the vehicle 100, the heat is transferred from the electronic components 11 via the heat-receiving block 13 and each of the header portions 14a to refrigerant. The transferred heat raises the temperature of the refrigerant and evaporates a part of the refrigerant. The evaporated refrigerant flows from the header portions 14a into the branch portions 14b via their proximal ends, and travels inside the branch portions 14b toward their distal ends. In other words, the evaporated refrigerant travels inside the heat pipes 14 toward the positive side in the Z-axis direction.

During running of the vehicle 100, the traveling wind A1 generated as the vehicle 100 travels flows into the cover 20 via the vents 20a on one surface of the cover 20. For example, as the vehicle 100 travels toward the positive side in the X-axis direction, the traveling wind A1 toward the negative side in the X-axis direction is generated and enters the cover 20 via the vents 20a formed on one surface of the cover 20, as illustrated in FIG. 3. The traveling wind A1 that has entered the cover 20 flows toward the negative side in the X-axis direction while coming into contact with the cooling device 12, in detail, the branch portions 14b and the fins 15. The traveling wind A1 then exits the cover 20 via the vents 20a formed on the other surface of the cover 20.

While the refrigerant is traveling inside the branch portions 14b toward the distal ends of the branch portions 14b as described above, the heat is transferred from the refrigerant via the branch portions 14b and the fins 15 to the traveling wind A1. The heat discharge from the refrigerant lowers the temperature of the refrigerant. The refrigerant is accordingly condensed into liquid. The refrigerant in the liquid state flows toward the proximal ends of the branch portions 14b and returns to the header portion 14a. In other words, the refrigerant in the liquid state flows inside the branch portions 14b toward the negative side in the Z-axis direction and returns to the header portion 14a. When the refrigerant that has condensed and returned to the header portion 14a receives the heat from the electronic components 11 via the heat-receiving block 13, the refrigerant is evaporated again, flows into the branch portions 14b, and then travels toward the distal ends of the branch portions 14b, in other words, travels toward the positive side in the Z-axis direction. The refrigerant thus repeats the above-described evaporation and condensation and thereby circulates, so that the heat emitted from the electronic components 11 is discharged to the traveling wind A1, resulting in cooling of the electronic components 11.

When the heat emitted from the electronic components 11 is transferred from the electronic components 11 via the heat-receiving block 13 and the header portions 14a to the refrigerant, then the refrigerant that has not been evaporated, that is, the refrigerant in the liquid state has internal temperature differences and generates convection. The convection allows the refrigerant to diffuse and transfer the heat from the electronic components 11 in the X-axis direction, leading to efficient cooling of the electronic components 11.

The above-described circulation and convection of the refrigerant can achieve cooling of the electronic components 11.

In order to improve the cooling efficiency of the power conversion apparatus 1, the branch portions 14b are preferably extended as long as possible within the vehicle gauge. The vehicle gauge means the maximum dimensions of the vehicle 100 in the section orthogonal to the traveling direction of the vehicle 100, that is, in the YZ plane. In other words, the vehicle 100 and the components installed in the vehicle 100 are located within the vehicle gauge in the YZ plane.

The vehicle gauge in the Z-axis direction may vary depending on the position in the Y-axis direction. The vehicle gauge in the Z-axis direction corresponds to the maximum dimension of the vehicle 100 in the Z-axis direction in the YZ plane. For example, the maximum height of the vehicle 100 at the center in the Y-axis direction is higher than the maximum height of the vehicle 100 at the ends in the Y-axis direction. In this case, the top ends in the vertical direction of the branch portions 14b at the center in the Y-axis direction are located higher than the top ends in the vertical direction of the branch portions 14b at the ends in the Y-axis direction, while the vehicle 100 is horizontally oriented. This configuration allows the branch portions 14b to be extended as long as possible within the vehicle gauge, thereby improving the cooling efficiency of the power conversion apparatus 1.

Also, the fins 15 are preferably expanded as large as possible within the vehicle gauge. The vehicle gauge in the Y-axis direction may vary depending on the position in the Z-axis direction. The vehicle gauge in the Y-axis direction corresponds to the maximum dimension of the vehicle 100 in the Y-axis direction in the YZ plane. For example, above the roof 100a, the vehicle gauge in the Y-axis direction has a narrower width at a higher position in the Z-axis direction. In this case, a length W1 in the Y-axis direction of the fin 15 disposed at a higher position in the vertical direction is shorter than a length W2 in the Y-axis direction of the fin 15 disposed at a lower position in the vertical direction. This configuration allows the fins 15 to be expanded as large as possible within the vehicle gauge, thereby improving the cooling efficiency of the power conversion apparatus 1.

In order to extend the branch portions 14b as long as possible and expand the fins 15 as large as possible within the vehicle gauge, the cover 20 preferably has a shape along the vehicle gauge.

Since the traveling wind A1 receives heat from the heat pipes 14 and the fins 15 as described above, the traveling wind A1 at a downstream site has a higher temperature than that at an upstream site. In other words, the heat pipe 14 at a posterior site in the traveling direction of the vehicle 100 has lower cooling efficiency than that of the heat pipe 14 at an anterior site in the traveling direction of the vehicle 100. This phenomenon may cause temperature differences in the electronic components 11 depending on their positions relative to the heat-receiving block 13. The header portions 14a therefore preferably extend in the flowing direction of the traveling wind A1, that is, in the X-axis direction. Because of the header portions 14a extending in the X-axis direction, convection of the refrigerant in the liquid state diffuses and transfers heat from the electronic components 11 in the X-axis direction and thus reduces the temperature differences in the electronic components 11.

The main surfaces of the individual fins 15 preferably extend in the flowing direction of the traveling wind A1, that is, in the X-axis direction. In this case, the traveling wind A1 that has been introduced via the vents 20a can smoothly flow along the fins 15, leading to improvement of the cooling efficiency of the power conversion apparatus 1. For example, in Embodiment 1, the main surfaces of the individual fins 15 extend in the X-axis direction, and the fins 15 are horizontally arranged while the vehicle 100 is horizontally oriented.

The ratio of the length in the Y-axis direction of at least any one of the fins 15 to a vehicle width W3, which is described below, of the vehicle 100 is preferably equal to or higher than a threshold value. The threshold value is determined depending on the cooling capacity required in the cooling device 12, and is 0.5, for example. In Embodiment 1, the ratio of the length W2 in the Y-axis direction of the fin 15 at a lower position in the vertical direction to the vehicle width W3 of the vehicle 100 is equal to or higher than 0.5, as illustrated in FIG. 4. Since the ratio of the length in the Y-axis direction of the fin 15 to the vehicle width W3 of the vehicle 100 is defined to be equal to or higher than the threshold value, the fin 15 is allowed to have a larger size than that of a fin included in a cooling device mounted on a side surface of an existing power conversion apparatus installed under the floor of a railway vehicle. The fin 15 having a larger size can achieve more efficient heat transfer to the traveling wind A1. The power conversion apparatus 1 therefore has higher cooling efficiency than those of existing power conversion apparatuses.

In the case where the main surface of the fin 15 is designed to have the area identical to that of a fin included in a cooling device mounted on a side surface of an existing power conversion apparatus installed under the floor of a railway vehicle, the length in the X-axis direction of the fin 15 can be reduced by extending the length in the Y-axis direction of the fin 15. A reduction in the length of the fin 15 in the X-axis direction, that is, in the flowing direction of the traveling wind A1 leads to a decrease in the pressure loss, so that a larger amount of the traveling wind A1 is allowed to flow between the fins 15. This configuration can accordingly improve the cooling efficiency of the power conversion apparatus 1 including the fin 15 having the main surface area identical to that of an existing fin.

As described above, the power conversion apparatus 1 according to Embodiment 1 is installed on the roof 100a of the vehicle 100, and includes the heat pipes 14 extending in a direction away from the heat-receiving block 13 that closes the opening 10a on the top in the vertical direction of the housing 10, and the fins 15 fixed at the heat pipes 14. The installation of the heat pipes 14 and the fins 15 on the roof 100a of the vehicle 100 can achieve efficient transfer of heat generated in the electronic components 11 to the traveling wind A1. This configuration can therefore improve the cooling capacity of the power conversion apparatus 1.

In the case of a small number of powered vehicles among coupled railway vehicles, in other words, in the case of a centralized train system, the powered vehicles include high-output motors. That is, a power conversion apparatus to feed electric power to each motor also has a higher output and thus emits a larger amount of heat. In an existing centralized train system, the power conversion apparatus is cooled by forcible wind supply from a blower. In contrast, in the power conversion apparatus 1 according to Embodiment 1, the electronic components 11 of the power conversion apparatus 1 can be cooled using the traveling wind A1 without a component, such as fan or blower, even in a centralized train system.

Embodiment 2

The power conversion apparatus 1 may also be installed at a place other than the top end in the vertical direction of the roof 100a of the vehicle 100. The description of Embodiment 2 is directed to an exemplary power conversion apparatus 1 installed in an accommodator 100b formed on the roof 100a of the vehicle 100. In Embodiment 2, the power conversion apparatus 1 and the accommodator 100b to accommodate the power conversion apparatus 1 are described below focusing on an exemplary accommodator 100b integrated with the roof 100a.

Figure 5:
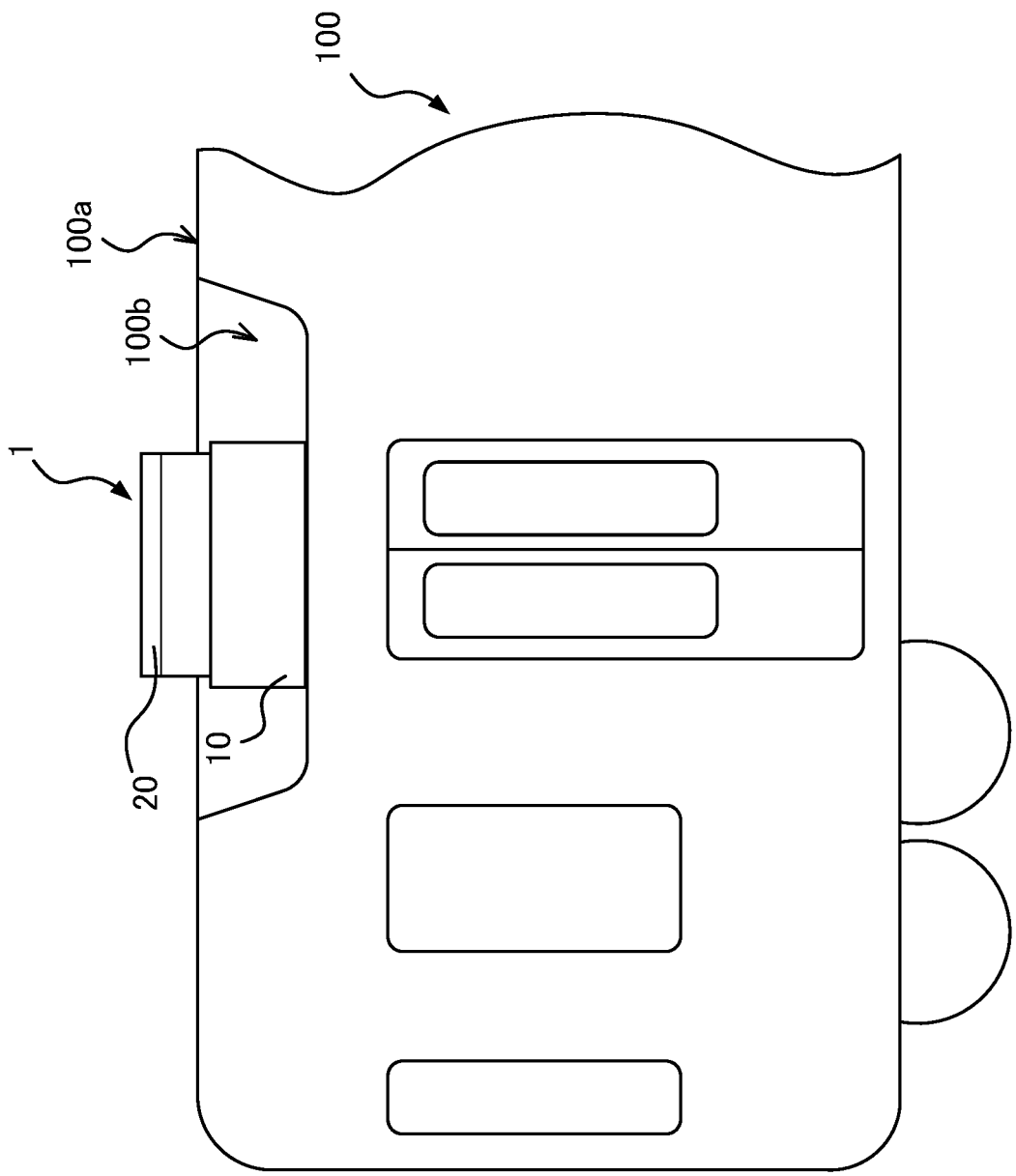
FIG. 5 illustrates an exemplary manner of installation of a power conversion apparatus according to Embodiment 2 in a vehicle.

As illustrated in FIG. 5, the roof 100a of the vehicle 100 is provided with the accommodator 100b, which is a recess having a top opening in the vertical direction. In detail, the top surface in the vertical direction of the accommodator 100b is open while the vehicle 100 is horizontally oriented. The accommodator 100b accommodates the housing 10 of the power conversion apparatus 1. In detail, the bottom of the housing 10 is fixed on the bottom of the accommodator 100b. The components of the power conversion apparatus 1 and the mechanism for cooling the electronic components 11 are identical to those in Embodiment 1.

The structure of the power conversion apparatus 1 for cooling the electronic components 11 using the traveling wind A1 is described in detail below.

Figure 6:
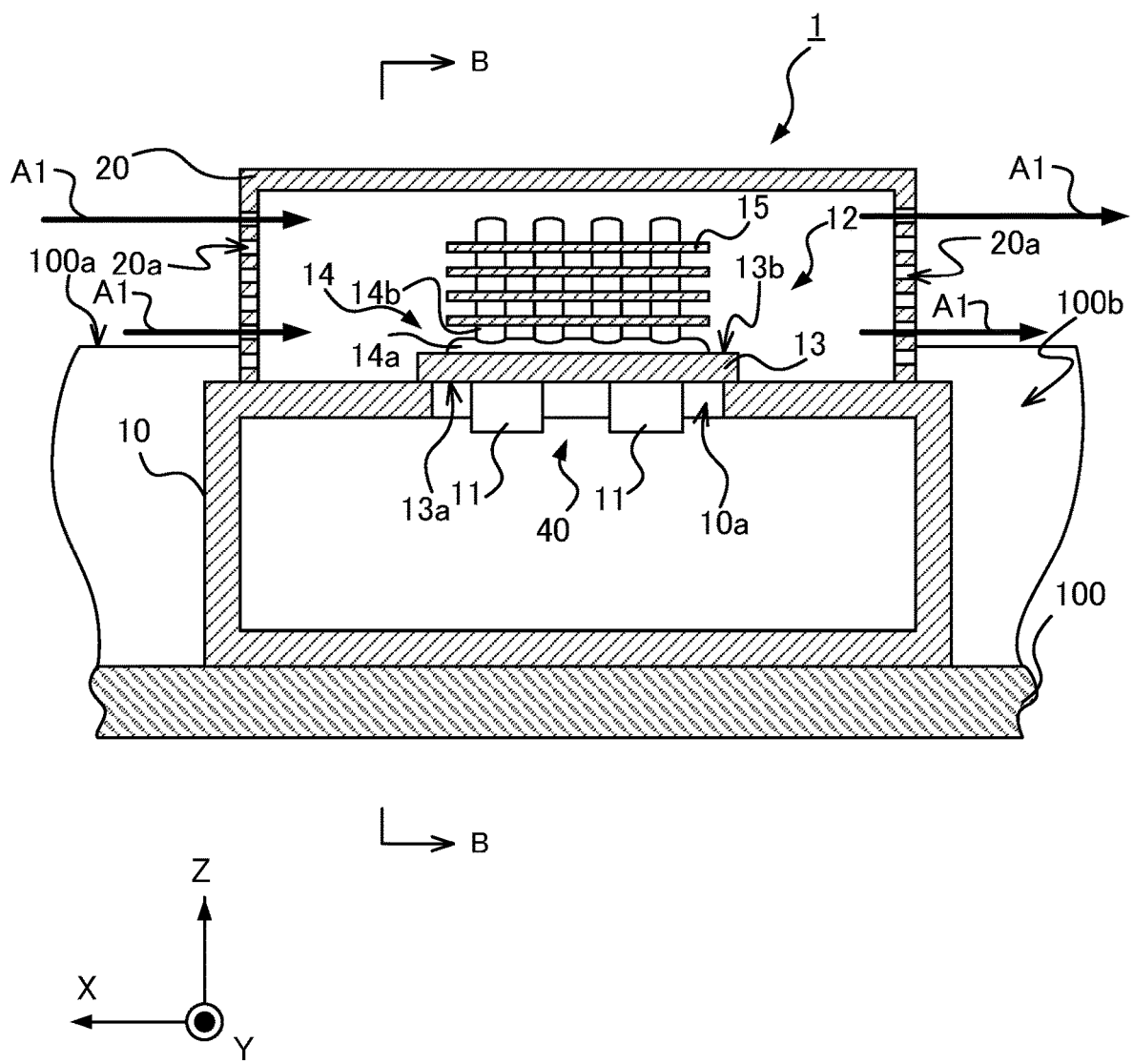
FIG. 6 is a sectional view of the power conversion apparatus according to Embodiment 2.
Figure 7:
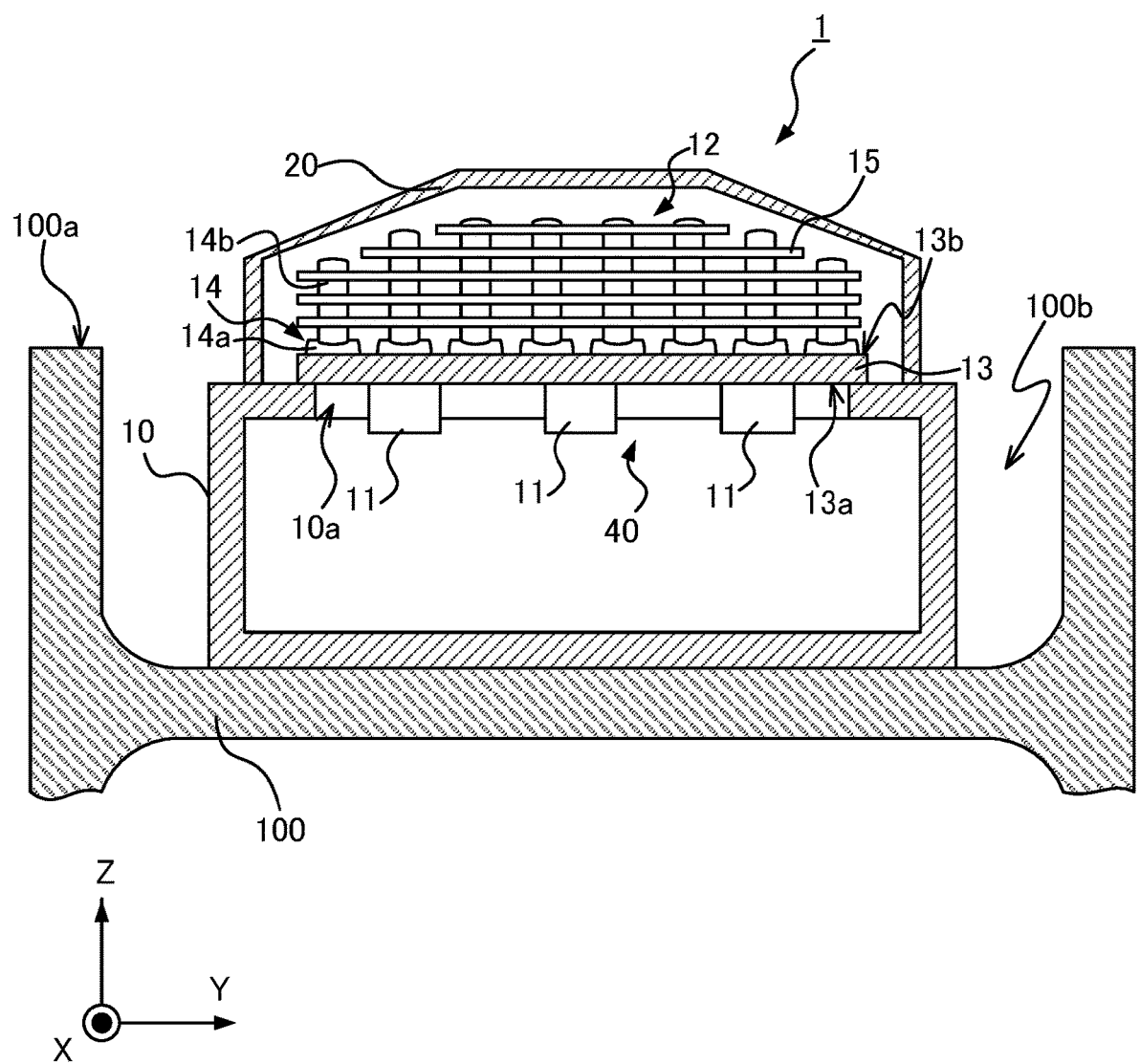
FIG. 7 is a sectional view of the power conversion apparatus according to Embodiment 2 taken along the line B-B of FIG. 6.

The top end in the vertical direction of at least any one of the heat pipes 14 is located higher than the top end in the vertical direction of the roof 100a while the vehicle 100 is horizontally oriented. As illustrated in FIGS. 6 and 7, the top ends in the vertical direction of the individual heat pipes 14 are located higher than the top end in the vertical direction of the roof 100a in Embodiment 2. The traveling wind A1 can thus come into contact with these heat pipes 14 regardless of the installation of the power conversion apparatus 1 in the accommodator 100b, and can thereby cool the electronic components 11.

In addition, at least any one of the fins 15 is located higher than the top end in the vertical direction of the roof 100a while the vehicle 100 is horizontally oriented. As illustrated in FIGS. 6 and 7, the individual fins 15 are located higher than the top end in the vertical direction of the roof 100a in Embodiment 2. The traveling wind A1 can thus come into contact with these fins 15 regardless of the installation of the power conversion apparatus 1 in the accommodator 100b, and can thereby cool the electronic components 11.

As described above, the power conversion apparatus 1 according to Embodiment 2 is installed in the accommodator 100b formed on the roof 100a of the vehicle 100 but still can cool the electronic components 11. In an exemplary case of the vehicle 100 having a large size relative to the vehicle gauge, the accommodator 100b on the roof 100a can allow the power conversion apparatus 1 to be installed on the roof 100a and cool the electronic components 11.

Embodiment 3

The description of Embodiment 3 is directed to a power conversion apparatus including wind guiding members 21 in order to introduce the traveling wind A1 more effectively into the cover 20.

Figure 8:
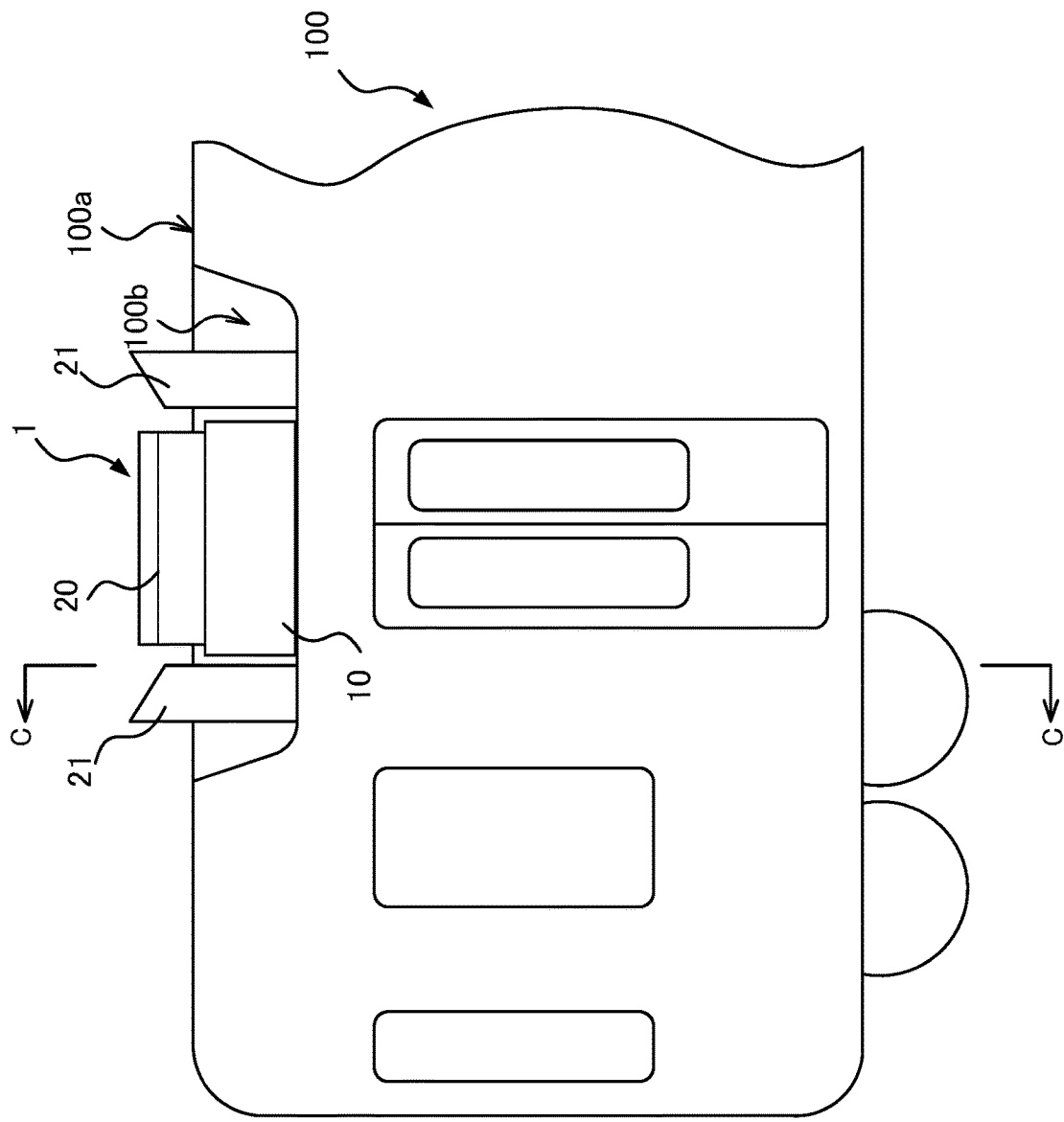
FIG. 8 illustrates an exemplary manner of installation of a power conversion apparatus according to Embodiment 3 in a vehicle.

As illustrated in FIG. 8, the power conversion apparatus 1 includes the wind guiding members 21 disposed adjacent to the respective outer surfaces of the housing 10 intersecting the traveling direction of the vehicle 100, that is, the X-axis direction. The wind guiding members 21 guide the traveling wind A1 to the cooling device 12. In detail, the wind guiding members 21 guide the traveling wind A1 to flow via the vents 20a on the cover 20 to the heat pipes 14 and the fins 15. In Embodiment 3, two wind guiding members 21 are arranged in the X-axis direction on both sides of the housing 10.

Figure 9:
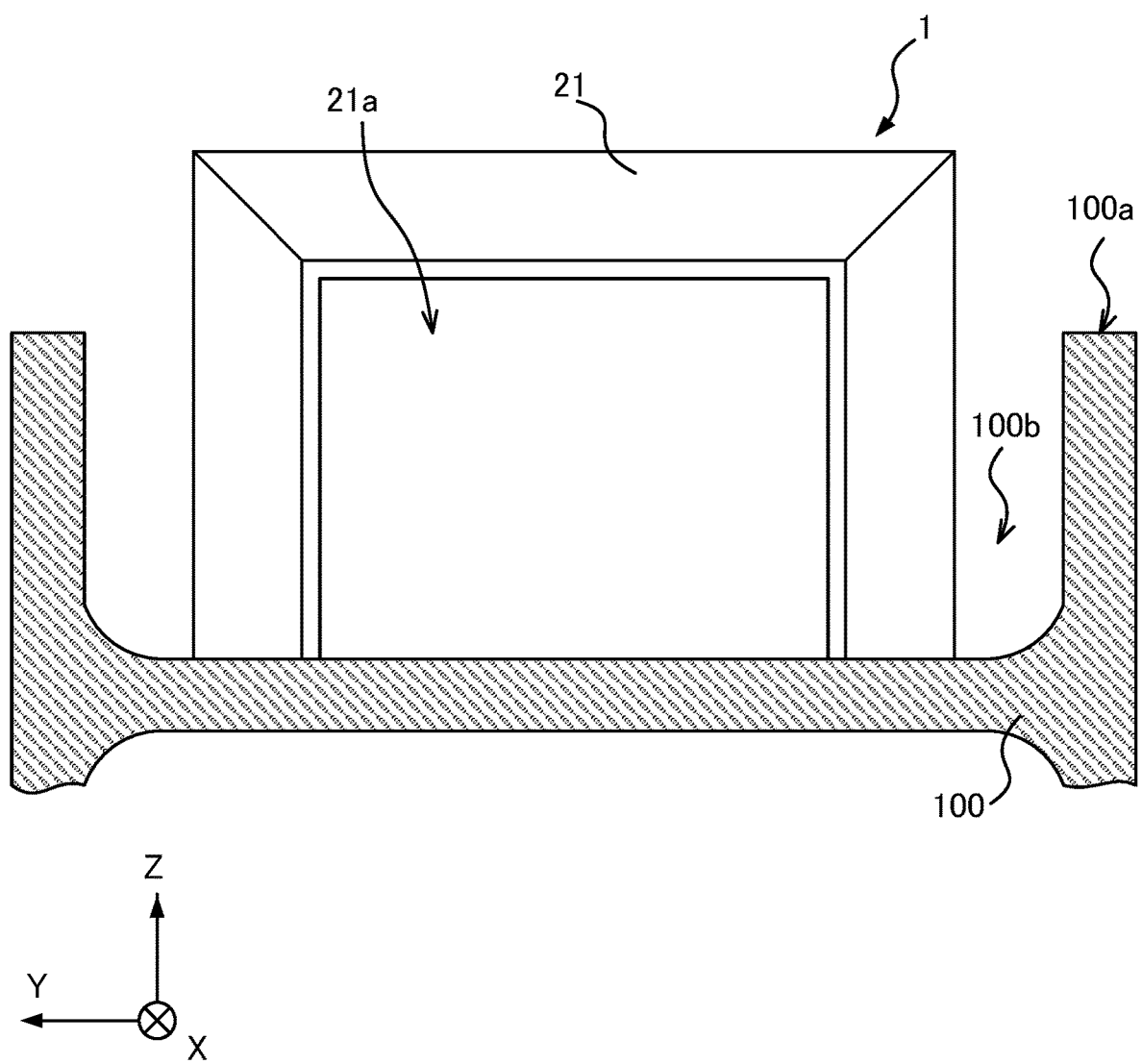
FIG. 9 is a sectional view of a wind guiding member according to Embodiment 3 taken along the line C-C of FIG. 8.

The shape of the wind guiding members 21 is described in detail below. As illustrated in FIG. 9, the wind guiding members 21 each have a shape of a tube having a through hole extending in the X-axis direction and lacking a part of the side surface. FIG. 9 is a sectional view taken along the line C-C of FIG. 8. In detail, the wind guiding member 21 has a shape of a square tube lacking one of the side surfaces. The wind guiding member 21 is mounted on the roof 100a such that the missing side surface of the tube faces the roof 100a. In FIG. 9, the missing side surface of the tubular wind guiding member 21 is mounted on the bottom of the accommodator 100b formed on the roof 100a. The wind guiding members 21 mounted on the roof 100a as described above define an air passage 21a against the roof 100a to guide the traveling wind A1 to the cooling device 12. In detail, the wind guiding members 21 define the air passage 21a extending in the X-axis direction in order to guide the traveling wind A1 via the vents 20a on the cover 20 to the heat pipes 14 and the fins 15.

The end face of the air passage 21a defined by the wind guiding members 21 adjacent to the housing 10 preferably has a smaller area than that of the end face of the air passage 21a distant from the housing 10. This configuration can efficiently guide the traveling wind A1 flowing along the roof 100a, to the heat pipes 14 and the fins 15.

As described above, the power conversion apparatus 1 according to Embodiment 3 is provided with the wind guiding members 21 and can thereby efficiently guide the traveling wind A1 to the cooling device 12.

The two wind guiding members 21 arranged in the X-axis direction on both sides of the housing 10 can efficiently guide the traveling wind A1 to the cooling device 12 in both cases of the vehicle 100 running toward the positive side in the X-axis direction and the vehicle 100 running toward the negative side in the X-axis direction.

The above-described embodiments may be combined with each other, and some of the components in the embodiments may be modified or omitted as appropriate.

For example, the power conversion apparatus 1 according to Embodiment 1 may include two wind guiding members 21 arranged in the X-axis direction on both sides of the housing 10. In other words, the wind guiding members 21 may be mounted on the top end in the vertical direction of the roof 100a while the vehicle 100 is horizontally oriented.

The electric power fed to the power conversion apparatus 1 is not necessarily DC power. For example, the power conversion apparatus 1 may also be a converter to convert AC power into DC power. Also, the electric power fed from the power conversion apparatus 1 to the load is not necessarily three-phase AC power. For example, the power conversion apparatus 1 may also feed DC power to the load, which is a DC motor.

The motor M1 is not necessarily the three-phase induction motor and may also be a synchronous motor or DC motor, for example. The power conversion apparatus 1 is not necessarily the self-cooled power conversion apparatus to feed electric power to the motor M1. Another example of the load to be fed with electric power from the power conversion apparatus 1 is any electric equipment, such as lighting equipment or air conditioner, which consumes electric power.

The power conversion apparatus 1 may be installed on not only the railway vehicle but also any moving body, such as trolleybus or tram, which accompanies the traveling wind A1.

The housing 10 may have any shape provided that the housing 10 can accommodate the electronic components 11 therein and can be installed on the roof 100a. For example, the top surface in the vertical direction of the housing 10 may be inclined from the horizontal plane while the vehicle 100 is horizontally oriented. In an exemplary case where the traveling direction of a vehicle is constant, the housing 10 preferably has the top surface declining toward the front side in the traveling direction of the vehicle. This configuration can more efficiently bring the traveling wind A1 into contact with the heat pipes 14 and the fins 15.

The heat-receiving block 13 may be made of a single plate member or a combination of multiple plate members. The heat-receiving block 13 made of a single plate member can simplify the process of fabricating the power conversion apparatus 1 and increase the air tightness of the housing 10.

Figure 10:
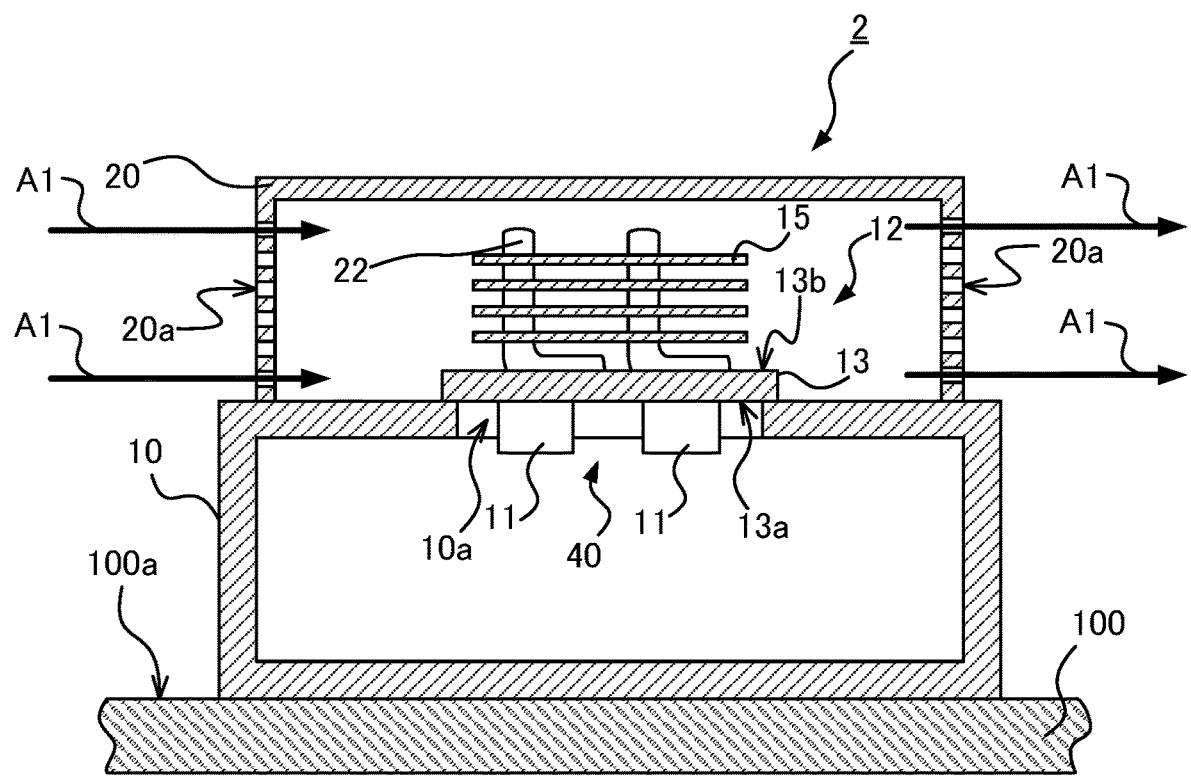
FIG. 10 is a sectional view of a first modification of the power conversion apparatus according to the embodiments.

The heat pipes 14 may have any shape provided that circulation of the refrigerant accommodated in the heat pipes 14 can cool the electronic components 11. For example, a power conversion apparatus 2 illustrated in FIG. 10 includes heat pipes 22 bent into an L-shape. A part of each of the heat pipes 22 extends in the X-axis direction and another part extends in the Z-axis direction. The power conversion apparatus 2 may also be installed in the accommodator 100b formed on the roof 100a, as in Embodiment 2.

For another example, the heat pipe 14 may have a U-shape or ring shape. The section of the heat pipe 14 orthogonal to its extending direction does not necessarily have a circular shape and may also have a flattened shape. In detail, the section of each of the header portion 14a and the branch portion 14b orthogonal to each extending direction may have a circular or flattened shape. The flattened shape indicates a shape formed by narrowing the width of a part of the circular shape than the original width and encompasses elliptical, streamline, and elongated circular shapes. The elongated circular shape indicates a shape defined by two circles having the same diameter and the straight lines connecting the contours of the circles with each other.

For another example, the heat pipes 14 may be in communication with the respective grooves formed in the heat-receiving block 13. In this case, each of the heat pipes 14 have a shape of a tube with a closed end.

The number of heat pipes 14 described above is a mere example and may be arbitrarily varied. Furthermore, the number of header portions 14a and the number of branch portions 14b fixed at each of the header portions 14a described above are mere examples and may be arbitrarily varied.

The positions of the top ends in the vertical direction of the heat pipes 14 may be mutually different as in the above-described embodiments or identical to each other.

The number of fins 15 described above is a mere example and may be arbitrarily varied.

The lengths in the Y-axis direction of the fins 15 may be mutually different as in the above-described embodiments or identical to each other.

The shape of the fins 15 described above is a mere example and may be arbitrarily modified. For example, the fin 15 may be made of a flat-plate member as in the above-described embodiments or a bent-plate member.

Figure 11:
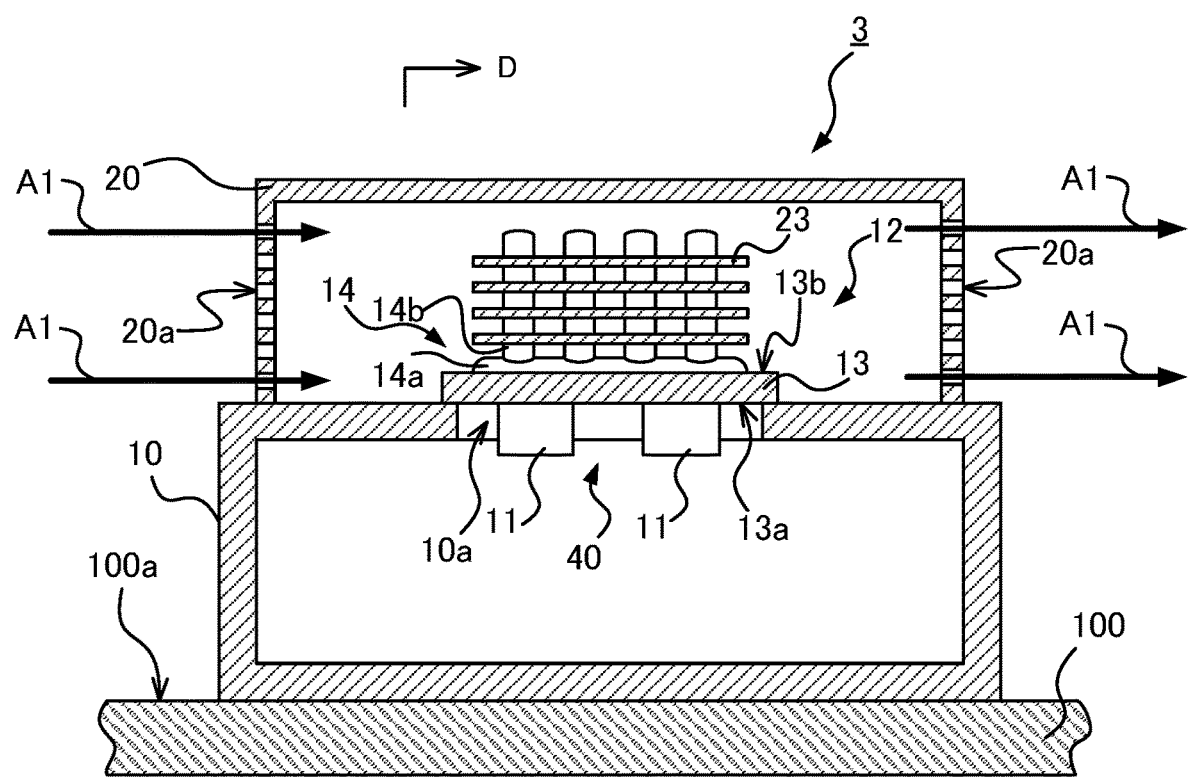
FIG. 11 is a sectional view of a second modification of the power conversion apparatus according to the embodiments.
Figure 12:
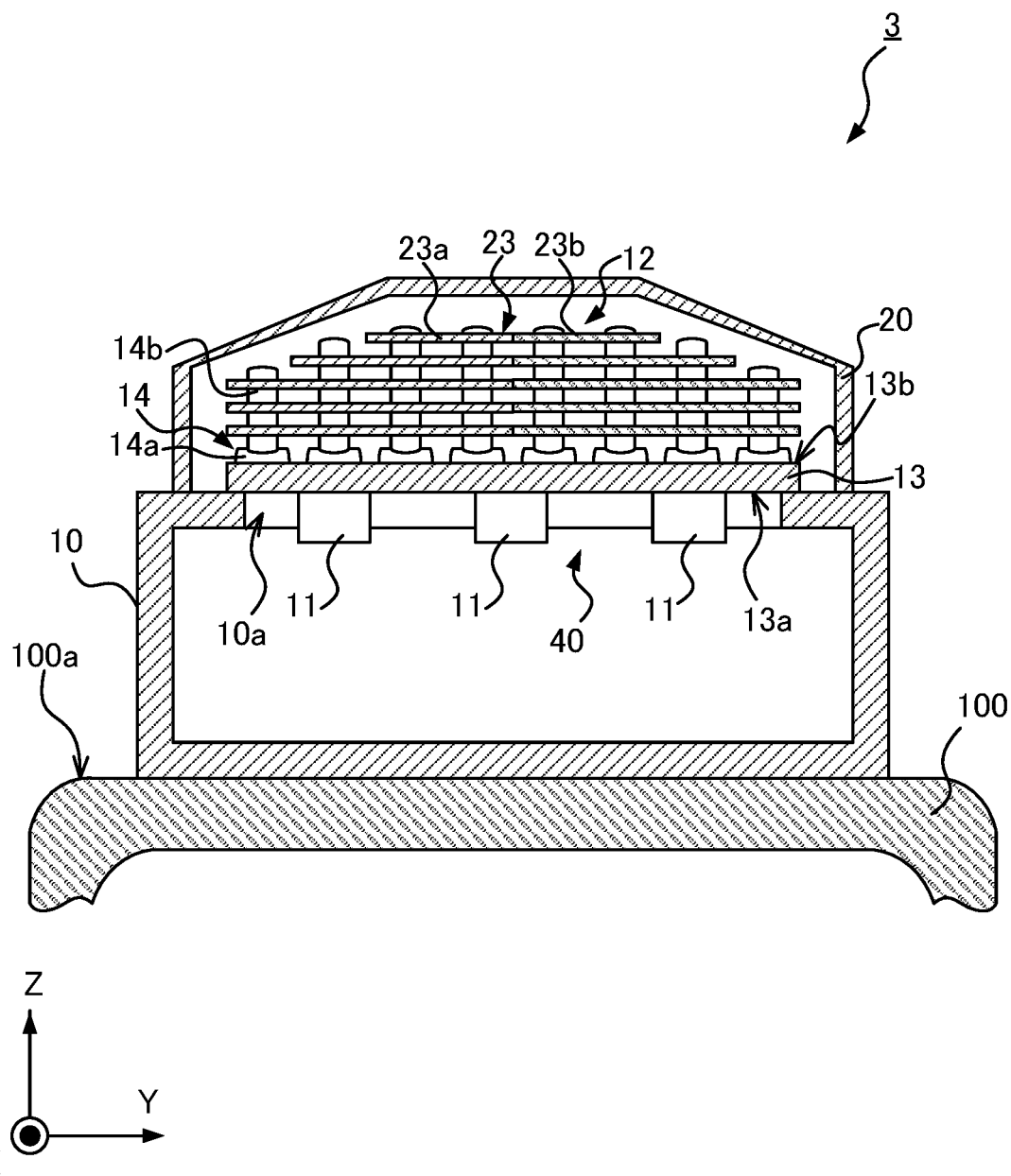
FIG. 12 is a sectional view of the second modification of the power conversion apparatus according to the embodiments taken along the line D-D of FIG. 11.

In the above-described embodiments, the fins 15 each of which is made of a single plate member are arranged in the Z-axis direction. The shape of the fins 15 described above is a mere example and the fins 15 may each be made of multiple plate members. For example, as illustrated in FIG. 11 and FIG. 12, which is a sectional view taken along the line D-D of FIG. 11, the cooling device 12 included in a power conversion apparatus 3 includes multiple fins 23. Each of the fins 23 is made of flat-plate members 23a and 23b.

The fins 15 may be made of the identical member, or at least any one of the fins 15 may be made of a member different from that of the other fins 15. In the case where at least any one of the fins 15 is made of a member different from that of the other fins 15, at least any one of the fins 15 has a thermal conductivity different from that of the other fins 15. In this case, the fin 15 at an upper position in the vertical direction preferably has a higher thermal conductivity than that of the fin 15 at a lower position in the vertical direction. For example, the fin 15 at an upper position in the vertical direction may be made of copper while the fin 15 at a lower position in the vertical direction may be made of aluminum.

The fin 15 at an upper position in the vertical direction can readily come into contact with the traveling wind A1 regardless of other equipment around the power conversion apparatus 1. That is, the cooling efficiency of the power conversion apparatus 1 can be improved by increasing the thermal conductivity of the fin 15 at the upper position in the vertical direction.

The cover 20 may have any shape provided that the cover 20 is disposed over the cooling device 12 and can introduce the traveling wind A1 into the cover 20. For example, the cover 20 may have a curved top surface in the vertical direction. For another example, the cover 20 may have a flat top surface in the vertical direction. The cover 20 preferably has a shape that maximizes the internal space within the vehicle gauge.

The wind guiding members 21 do not necessarily have a shape of a square tube lacking one of the side surfaces and may also have any shape provided that the wind members 21 can guide the traveling wind A1 to the cooling device 12. For example, the wind guiding members 21 may have a hollow cylindrical shape lacking a part of the side surface. For another example, the wind guiding member 21 may have a shape of a tube the side surfaces of which are partially fixed on the roof 100a and which has a polygonal section.

The wind guiding members 21 may be disposed apart from the housing 10 and the cover 20 as illustrated in the embodiments, or may be disposed in contact with at least either of the housing 10 and the cover 20.

Any number of wind guiding members 21 may be provided. In an exemplary case where the traveling direction of a vehicle is constant, a single wind guiding member 21 may be provided on the front of the vehicle in the traveling direction.

The switching elements 33a to 33f may include a wide bandgap semiconductor. The wide bandgap semiconductor contains a silicon carbide, gallium nitride martial, or diamond, for example.

Figure 13:
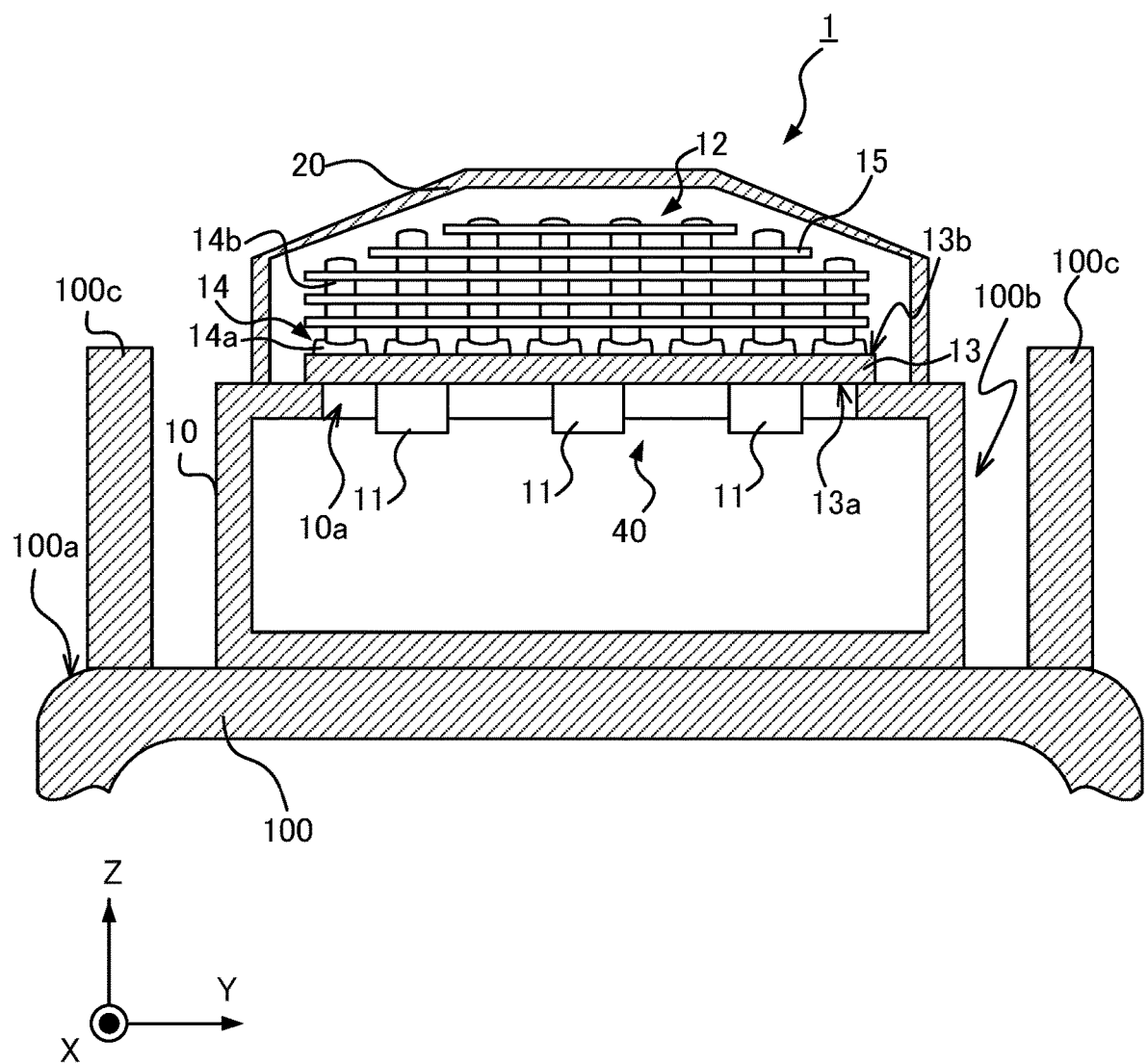
FIG. 13 illustrates another exemplary manner of installation of the power conversion apparatus according to the embodiments in a vehicle.

The plane of the opening of the accommodator 100b may be in parallel to the horizontal plane while the vehicle 100 is horizontally oriented as in Embodiment 2, or inclined from the horizontal plane while the vehicle 100 is horizontally oriented. The accommodator 100b may be independent from the roof 100a. For example, as illustrated in FIG. 13, the accommodator 100b may be replaced with a pair of on-roof covers 100c that face each other in the width direction. The main surfaces of the on-roof covers 100c face each other in the width direction. The on-roof covers 100c may each be a plate member having a flat main surface or a plate member having a curved main surface.

Each of the power conversion apparatuses 1 to 3 may further include a sealing member that surrounds the opening 10a and is in contact with the housing 10 and the heat-receiving block 13. The sealing member can improve the air tightness of the housing 10.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST 1, 2, 3 Power conversion apparatus
10 Housing
10a Opening
11 Electronic component
12 Cooling device
13 Heat-receiving block
13a First main surface
13b Second main surface
14, 22 Heat pipe
14a Header portion
14b Branch portion
15, 23 Fin
20 Cover
20a Vent
21 Wind guiding member
21a Air passage
23a, 23b Flat-plate member
31a, 31b Primary terminal
32 Power converter
33a, 33b, 33c, 33d, 33e, 33f Switching element
40 Unit
100 Vehicle
100a Roof
100b Accommodator
100c On-roof cover
A1 Traveling wind
FC1 Filter capacitor
M1 Motor
W1, W2 Length
W3 Vehicle width

The invention claimed is:

1. A power conversion apparatus, comprising:
a power converter comprising electronic components, the power converter being configured to convert fed electric power into electric power to be fed to a load and feed the converted electric power to the load;
a housing disposed on a roof of a vehicle, the housing having an opening on a top in a vertical direction, the housing being configured to accommodate the electronic components;
a heat-receiving block attached to the housing, the heat-receiving block having one main surface to which the electronic components are attached, the heat-receiving block being configured to close the opening; and
at least one heat pipe attached to another main surface of the heat-receiving block and extending in a direction away from the heat-receiving block, the at least one heat pipe being configured to accommodate refrigerant therein, wherein
the housing is attached to the roof such that the housing is attachable to and detachable from the roof in the vertical direction while the vehicle is horizontally oriented.

2. The power conversion apparatus according to claim 1, wherein the housing is accommodated in an accommodator disposed on the roof of the vehicle, the accommodator having a top opening in the vertical direction.

3. The power conversion apparatus according to claim 1, wherein a top end in the vertical direction of at least any one of the at least one heat pipe is located higher than a top end in the vertical direction of the roof while the vehicle is horizontally oriented.

4. The power conversion apparatus according to claim 1, wherein the at least one heat pipe extends in the vertical direction while the vehicle is horizontally oriented.

5. The power conversion apparatus according to claim 1, wherein
the at least one heat pipe is a plurality of heat pipes, and
a top end in a vertical direction of a first heat pipe of the plurality of heat pipes is located higher than a top end in a vertical direction of a second heat pipe of the plurality of heat pipes while the vehicle is horizontally oriented, the first heat pipe being disposed at a center in a width direction of the vehicle among the plurality of heat pipes, the second heat pipe being disposed at an end in the width direction of the vehicle among the plurality of heat pipes.

6. The power conversion apparatus according to claim 1, further comprising:
at least one fin fixed at an outer surface of the at least one heat pipe.

7. The power conversion apparatus according to claim 6, wherein at least any one of the at least one fin is located higher than a top end in the vertical direction of the roof while the vehicle is horizontally oriented.

8. The power conversion apparatus according to claim 6, wherein
the at least one fin is made of a plate member, and
the at least one fin has a main surface extending in a traveling direction of the vehicle.

9. The power conversion apparatus according to claim 6, wherein a ratio of a length of at least any one of the at least one fin in a width direction of the vehicle to a vehicle width of the vehicle is equal to or higher than a threshold.

10. The power conversion apparatus according to claim 6, wherein
the at least one fin is a plurality of fins, and
a length of a first fin of the plurality of fins in a width direction of the vehicle is shorter than a length of a second fin of the plurality of fins in the width direction of the vehicle, the first fin being disposed at an upper position in the vertical direction among the plurality of fins, the second fin being disposed at a lower position in the vertical direction among the plurality of fins.

11. The power conversion apparatus according to claim 6, wherein
the at least one fin is a plurality of fins, and
any one of the plurality of fins has a thermal conductivity different from a thermal conductivity of another one of the plurality of fins.

12. The power conversion apparatus according to claim 11, wherein a first fin of the plurality of fins has a thermal conductivity higher than a thermal conductivity of a second fin of the plurality of fins, the first fin being disposed at an upper position in the vertical direction among the plurality of fins, the second fin being disposed at a lower position in the vertical direction among the plurality of fins.

13. The power conversion apparatus according to claim 6, further comprising:
a cover attached to the housing and disposed over the at least one heat pipe and the at least one fin, the cover having vents on two surfaces intersecting a traveling direction of the vehicle.

14. The power conversion apparatus according to claim 1, wherein a unit is attached to the housing such that the unit is attachable to and detachable from the housing in the vertical direction while the vehicle is horizontally oriented, the unit comprising the at least one heat pipe, the heat-receiving block, and the electronic components attached to the heat-receiving block.

15. The power conversion apparatus according to claim 1, further comprising:
a wind guiding member disposed adjacent to an outer surface of the housing, the outer surface intersecting a traveling direction of the vehicle, the wind guiding member being configured to guide traveling wind to the at least one heat pipe, the traveling wind being generated as the vehicle travels.

16. The power conversion apparatus according to claim 15, wherein a height of a proximal end of the wind guiding member in the vertical direction is lower than a height of a distal end of the wind guiding member in the vertical direction while the vehicle is horizontally oriented, the proximal end being adjacent to the housing, the distal end being distant from the housing.

17. The power conversion apparatus according to claim 15, wherein
the wind guiding member has a shape of a tube having a through hole extending in the traveling direction of the vehicle and lacking a part of a side surface, and
the wind guiding member is attached to the roof such that a missing part of the tube faces the roof, and thereby defines an air passage against the roof to guide the traveling wind to the at least one heat pipe.

18. The power conversion apparatus according to claim 1, further comprising:
a sealing member surrounding the opening of the housing and being in contact with the housing and the heat-receiving block.

19. A power conversion apparatus, comprising:
a power converter comprising electronic components, the power converter being configured to convert fed electric power into electric power to be fed to a load and feed the converted electric power to the load;
a housing disposed on a roof of a vehicle, the housing having an opening on a top in a vertical direction, the housing being configured to accommodate the electronic components;
a heat-receiving block attached to the housing, the heat-receiving block having one main surface to which the electronic components are attached, the heat-receiving block being configured to close the opening; and
at least one heat pipe attached to another main surface of the heat-receiving block and extending in a direction away from the heat-receiving block, the at least one heat pipe being configured to accommodate refrigerant therein, wherein
the housing is accommodated in an accommodator disposed on the roof of the vehicle, the accommodator having a top opening in the vertical direction.

20. A power conversion apparatus, comprising:
a power converter comprising electronic components, the power converter being configured to convert fed electric power into electric power to be fed to a load and feed the converted electric power to the load;
a housing disposed on a roof of a vehicle, the housing having an opening on a top in a vertical direction, the housing being configured to accommodate the electronic components;
a heat-receiving block attached to the housing, the heat-receiving block having one main surface to which the electronic components are attached, the heat-receiving block being configured to close the opening; and
at least one heat pipe attached to another main surface of the heat-receiving block and extending in a direction away from the heat-receiving block, the at least one heat pipe being configured to accommodate refrigerant therein, wherein
the at least one heat pipe is a plurality of heat pipes, and
a top end in a vertical direction of a first heat pipe of the plurality of heat pipes is located higher than a top end in a vertical direction of a second heat pipe of the plurality of heat pipes while the vehicle is horizontally oriented, the first heat pipe being disposed at a center in a width direction of the vehicle among the plurality of heat pipes, the second heat pipe being disposed at an end in the width direction of the vehicle among the plurality of heat pipes.

* * * * *